United States Patent [19]

Lu et al.

[11] Patent Number: 5,036,378
[45] Date of Patent: Jul. 30, 1991

[54] MEMORY DEVICE

[75] Inventors: Chih-Yuan Lu, Lower Macungie Township, Lehigh County; Tah-Kang J. Ting, Upper Macungie Township, Lehigh County, both of Pa.

[73] Assignee: AT&T Bell Laboratories, Murray Hill, N.J.

[21] Appl. No.: 430,390

[22] Filed: Nov. 1, 1989

[51] Int. Cl.⁵ .............................................. H01L 29/78
[52] U.S. Cl. .................................. 357/23.5; 357/23.11; 357/41; 357/42; 357/46; 357/59; 365/185
[58] Field of Search ..................... 357/23.5, 23.11, 41, 357/42, 46, 59; 365/185

[56] References Cited

U.S. PATENT DOCUMENTS

| | | | |
|---|---|---|---|
| 4,361,847 | 11/1982 | Harari | 357/23 |
| 4,409,723 | 10/1983 | Harari | 29/571 |
| 4,490,900 | 1/1985 | Te-Long Chiu | 29/571 |
| 4,558,344 | 12/1985 | Perlegos | 357/59 |
| 4,701,776 | 10/1987 | Perlegos et al. | 357/23 |
| 4,750,024 | 6/1988 | Schreck | 357/23.5 |
| 4,844,776 | 7/1989 | Lee et al. | 156/653 |
| 4,853,895 | 9/1989 | Mitchell et al. | 357/23.5 |
| 4,855,800 | 8/1989 | Esquivel et al. | 357/23.5 |

Primary Examiner—Edward J. Wojciechowicz
Attorney, Agent, or Firm—R. D. Laumann

[57] ABSTRACT

A compact, high speed EEPROM is disclosed. The design features mirror-image pairs of cells with a common junction buried under a thick oxide. The oxide also supports a portion of the control and floating gates. A single erase gate, also above the oxide, is capable of erasing two rows of cells at once. Each cell also has a second junction which contacts the semiconductor substrate surface. The second junction has a conductive landing pad which facilitates small cell size.

3 Claims, 6 Drawing Sheets

MEMORY DEVICE

TECHNICAL FIELD

The present invention relates to semiconductor memory cells in general and more particularly to a non-volatile memory cell including a programmable and erasable floating gate structure.

BACKGROUND OF THE INVENTION

A variety of metal-oxide-semiconductor (MOS) devices have been developed to store information in non-volatile binary form. One popular type of non-volatile MOS storage device utilizes an insulated or floating gate overlying an active substrate. Charge carriers are transported to and from the floating gate by various structures and mechanisms during "write" and "erase" operations. The presence or absence of charge on the floating gate may be sensed and then interpreted as a "1" or "0" during "read" operations.

One early (and popular) non-volatile MOS memory utilized an application of radiation, typically ultraviolet light, to accomplish erasure of the memory cells. However, more recent development has centered about devices which may be electrically erased.

Some non-volatile cells are erased by causing transfer of charge from the floating gate to the active substrate. Other designs employ an additional third gate for erasing. Charge may be transferred from the floating gate to the third gate, termed the "erase" gate. A "flash" EEPROM is an electrically-erasable, programmable ROM in which all or almost all of the cells may be erased simultaneously.

There remain, however, a variety of problems confronting designers of non-volatile memory devices. One almost universally desired goal is the achievement of small cell size. Compared to typical standard MOS transistors and even to various dynamic random access memory cells, non-volatile cells are rather large. For various reasons, non-volatile cells cannot always be easily scaled downward as semiconductor process linewidths and feature sizes decrease.

Designers in search of ever denser memory chips have also investigated various compact array designs. The current trend in array design is toward the use of "virtual ground" arrays. The virtual ground array may be made locally "contactless." There is no need to create space-consuming windows above the source/drain junctions because the junctions themselves may serve as buried bit lines.

However, virtual ground arrays may exhibit unpredictable performance if certain bit patterns are stored in them (a phenomenon termed "pattern sensitivity") and the entire array may be disabled if one bit line should be shorted to the substrate or any other signal lines (a phenomenon termed "fault propagation"). Thus, the increasingly popular virtual ground type array, despite its contactless feature presents various disadvantages which may affect both reliability and yield.

Those concerned with the development of memory devices have continuously sought smaller, more space-efficient cell designs which may be incorporated into reliable arrays which are not vulnerable to bit line failure or pattern sensitivity.

SUMMARY OF THE INVENTION

The present invention features a memory device with means for controlling current flow, for example, control, floating, and erase gates. One junction region of the device is "buried" in the substrate under a comparatively thick oxide, while the other junction reaches the substrate surface. The junction which reaches the surface may, if desired, be contacted via an opening in an overlying dielectric. The basic memory cell is small, and may be arranged into a compact non-virtual-ground-type array. A variety of advantages, particularly in high speed operation and circuit compatibility obtainable from the inventive device, are detailed in the paragraphs that follow.

DETAILED DESCRIPTION

The following paragraphs will first describe the physical structure of the inventive device and generally how it is fabricated. Then operation (i.e., reading, writing, and erasing) of the device will be described. Next, operation of the inventive device within a circuit array will be discussed.

Figure 1:
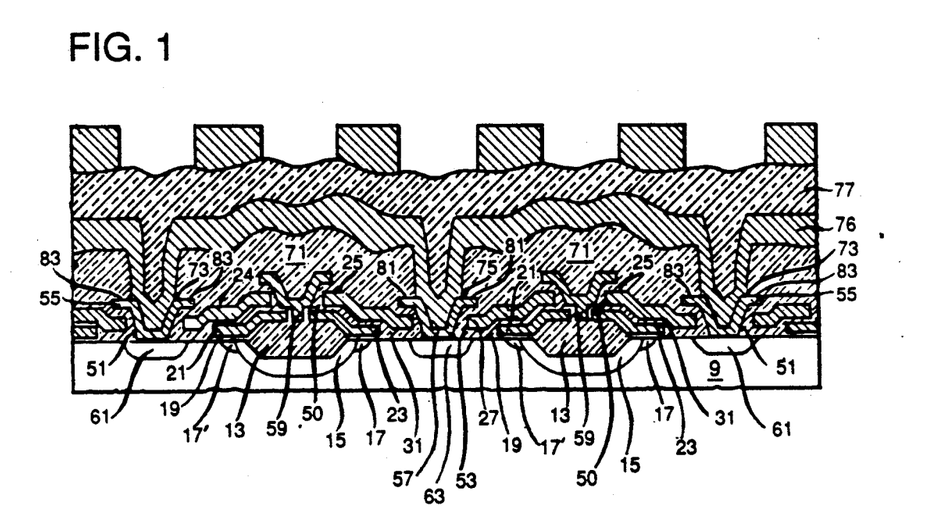
FIG. 1 is a schematic cross-sectional view of an inventive device according to the present invention.
Figure 4:
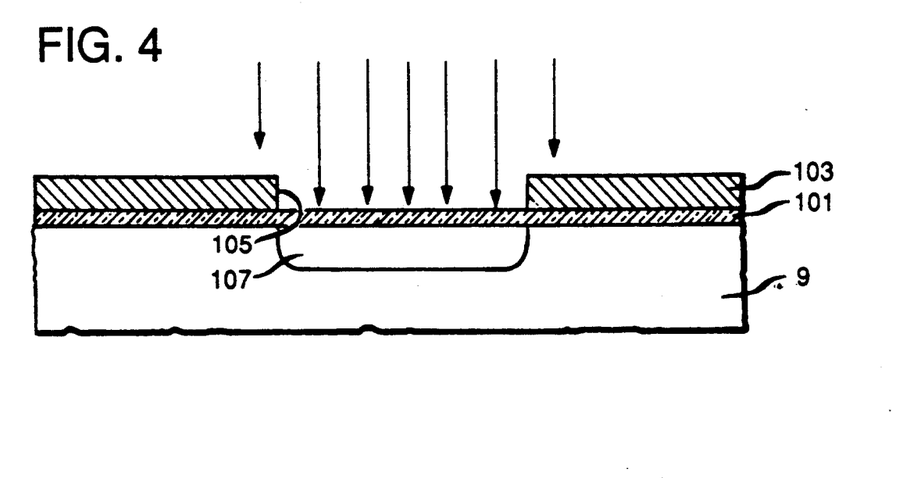
FIGS. 4–10 are cross-sectional views illustrating partial fabrication sequences for the present invention.
Figure 5:
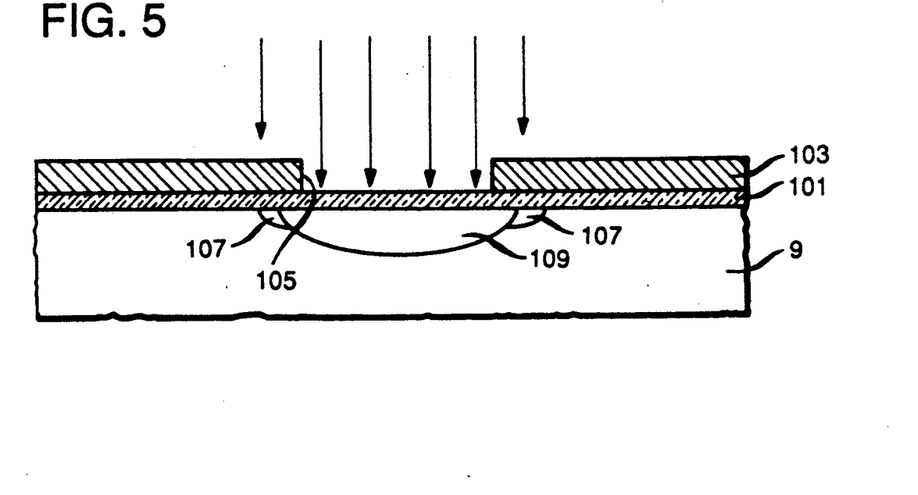
Figure 6:
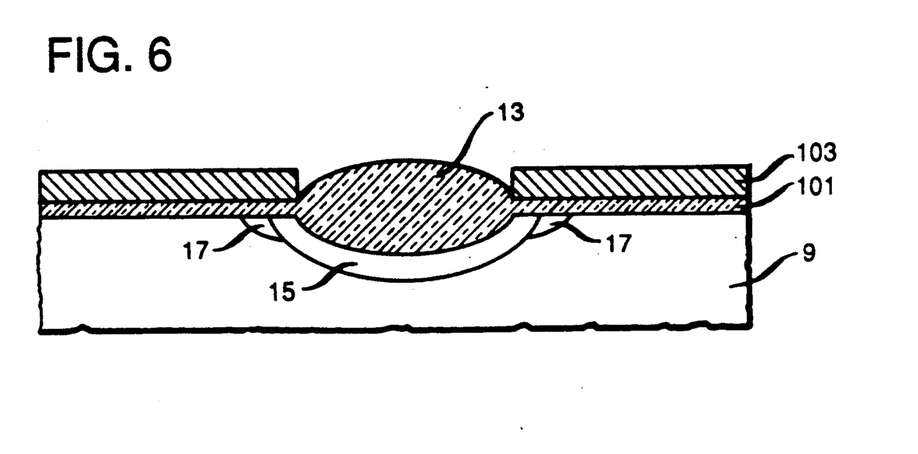

FIG. 1 is a cross-sectional view of a typical pair of devices according to the present invention. Reference numeral 9 denotes a substrate which for purposes of the present discussion is assumed to be p-type. An n-type substrate may also be used, in which case, of course, the dopings of the various buried regions and all junction areas to be discussed in the following paragraphs must be changed from n to p and vice versa. Reference numeral 15 denotes a buried n+ region, while reference numerals 17 and 17' denote p+ regions. Thick oxide region 13 (termed "buried n+ oxide") overlies region 15. FIGS. 4–6 indicate the manner in which buried n+ oxide region 13 together with buried n+ region 15 and p+ regions 17 and 17' are fabricated.

Turning to FIG. 4, there is shown a typical cross-section of a semiconductor wafer during the initial steps of fabrication. Reference numeral 101 denotes a pad oxide and reference numeral 103 denotes a patterned nitride layer formed by techniques well known to those skilled in the art. Patterned layer 103 has opening 105. After patterned nitride layer 103 has been formed, a p-type ion implantation, for example, with boron ions, is performed through opening 105, producing a buried p+ region 107. After the p+ ion species is implanted, a thermal drive-in step is performed to further diffuse the p+ species. Then a second ion implantation, with n-type ions, for example arsenic, is performed to produce a buried n+ region 109 as shown in FIG. 5.

The resulting pattern of n+ and p+ regions is illustrated in FIG. 5 with the buried p+ region denoted by reference numeral 107 extending somewhat further laterally than the buried n+ region 109 because of the previously-mentioned thermal drive-in step.

After n+ species has been implanted, a thermal oxide 13 is grown in opening 105, as shown in FIG. 6, by conventional processes. Field oxide 11 shown in the top view of FIG. 2 may be grown at the same time. (Thus, when layers 103 and 101 are patterned, they may be patterned for both field oxide 11 and buried n+ oxide 13. Of course, the exposed silicon in the regions designated for subsequent field oxide growth must be shielded with a resist from the ion implantation steps described above.) The reference numerals of the buried regions in FIG. 6 have been re-adjusted to conform to the reference numerals of the completely formed regions in FIG. 1. The reference numeral 107 has been changed to 17 and 17' and reference numeral 109 has been changed to 15.

Thus, FIGS. 4–6 have illustrated the manner in which buried n+ oxide 13 together with buried n+ region 15 and buried p+ regions 17 and 17', all illustrated in FIG. 1, are formed. A highly desirable feature of the disclosed process is that no separate masking step is required to form buried p+ regions 17 and 17'. The buried p+ regions may extend laterally outward as far as the edge of floating gates 21 and 23.

Oxide region 13 ("buried n+ oxide") is not a field oxide (although it is grown by similar processes). Oxide region 13, as will be subsequently explained, does not serve to isolate two transistors in the way that a conventional field oxide isolates two transistors. As will be subsequently detailed, buried n+ region 15 is shared by two transistor-like cells. Furthermore, oxide region 13 provides a platform for the processing steps to be described below which create structures 23, 25, and 59 (FIG. 1). Such processing (which involves general etching and depositions) cannot reliably be carried out over a thin oxide region. Other features and advantages of oxide region 13 will be mentioned in later paragraphs. Typically, the total thickness of oxide region 13 is 3000 Å although thickness between 1000 Å and 6000 Å are acceptable.

Continuing with FIG. 1, after removal of layers 101 and 103 dielectric (preferably silicon oxide) layer 19 is deposited.

Figure 7:
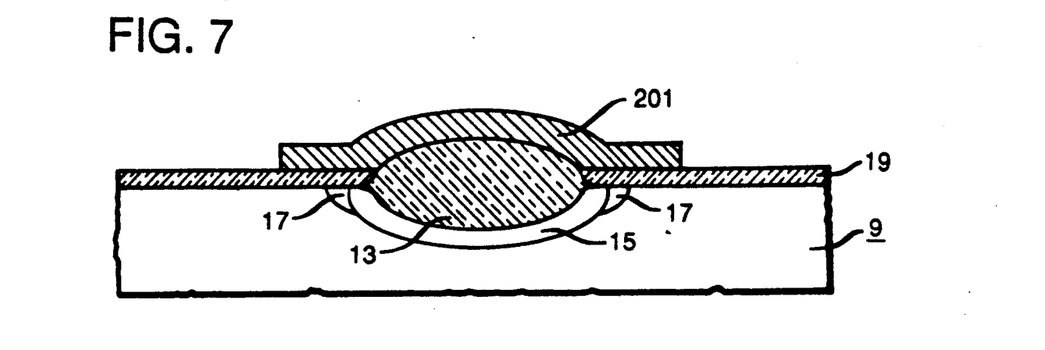

Next, floating gates denoted by reference numerals 21 and 23 are fabricated by deposition and patterning of polysilicon. FIGS. 7–10 illustrate some of the principal fabrication steps involved in forming floating gates 21 and 23. Turning to FIG. 7, patterned polysilicon layer 201 (which will eventually become floating gates 21 and 23) has been deposited over buried n+ oxide 13 and oxide layer 19. Layer 201 has a stepped profile because it extends over buried n+ oxide 13.

Figure 8:
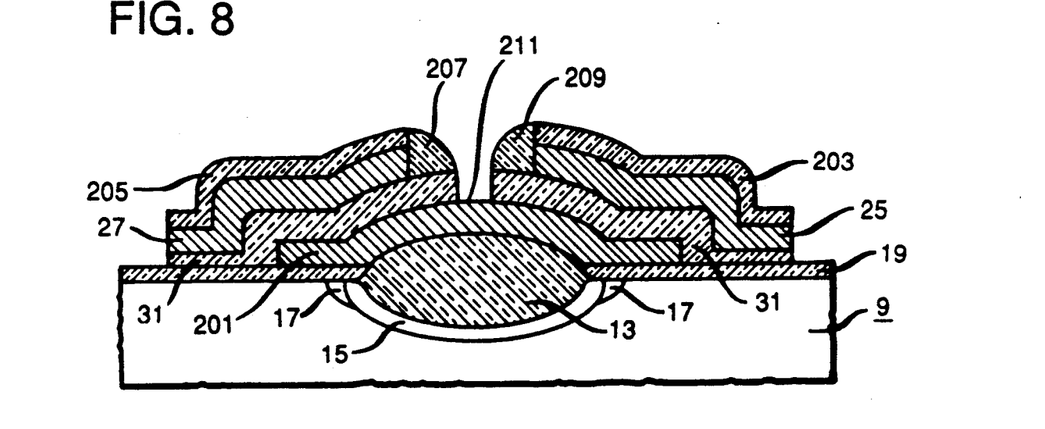

In FIG. 8, oxide layer 31 is grown over polysilicon layer 201. Then a second polysilicon layer is deposited, covered by an oxide layer, and subsequently patterned to form control gates 25 and 27 with overlying oxides 203 and 205 respectively. After polysilicon layers 25 and 27 have been formed, an additional oxide layer is deposited on top (of layers 203 and 205) and anisotropically etched to produce spacers 207 and 209 and opening 211. If desired, a double spacer may be formed by deposition and subsequent etching of two different types of glass.

Figure 9:
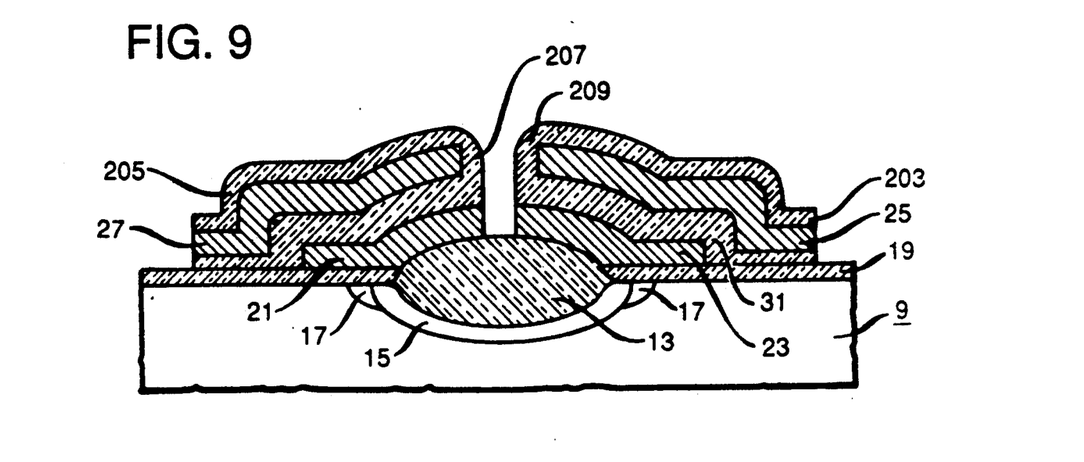

Turning to FIG. 9 it will be noted that polysilicon layer 201 has been cut or severed, forming floating gates 21 and 23 by anisotropic etching through opening 211 defined by spacers 207 and 209. Thus, the spacer technique illustrated in FIGS. 7–9 permits the self-alignment of, for example, floating gate 23 with control gate 25 and floating gate 21 with control gate 27.

Figure 10:
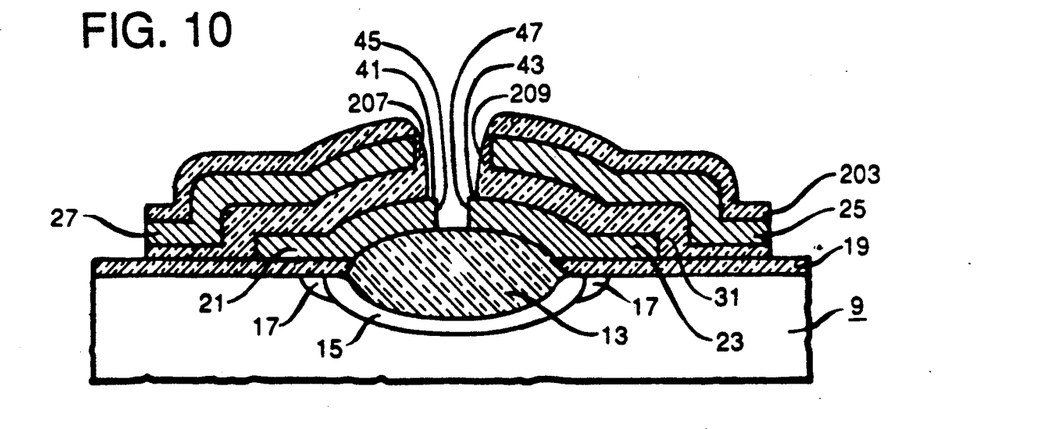

Turning now to FIG. 10, spacers 207 and 209 have been etched back somewhat to expose top surfaces 41 and 43 of floating gates 21 and 23 respectively.

If spacers 207 and 209 were double spacers, the outer spacer may be etched away to expose surfaces 41 and 43. An etch process which preferentially attacks the outer spacer without damaging the inner spacer may be used.

Next an additional oxide layer (50 in FIG. 1) is formed over control gates 25 and 27. The additional oxide layer also covers surfaces 41 and 43, together with surfaces 45 and 47 (i.e., the sides of floating gates 21 and 23 respectively). The oxide is preferably grown in a manner which produces asperities in surfaces 41 and 43.

Next, returning to FIG. 1, windows 51 and 53 are lithographically defined and opened. The window opening exposes the bare upper surface of silicon substrate 9. Next, a third layer of polysilicon is blanket-deposited and patterned. The patterned polysilicon produces structurers 55, 57, and 59. Structure 59 is the erase gate whose operation will be described in greater detail later. Structures 55 and 57 are termed "landing pads." It will be noted that the deposition of the third polysilicon layer conveniently forms erase gate 59 while simultaneously forming polysilicon landing pads 55 and 57. As will be noted from an examination of FIG. 12, landing pads 55 and 57 have a flower-vase-like shape, while erase gate 59 has a shape somewhat reminiscent of an elongated trough. In particular, the landing pads have protrusions 81 and 83 which extend laterally beyond the original window dimensions.

Junction regions 61 and 63 may be formed either by ion implantation after windows 51 and 53 have been opened or by diffusion of dopant species from polysilicon landing pads 55 and 57 by techniques well known to those skilled in the art.

Then passivation dielectric layer 71 is deposited.

The next steps in fabrication of the inventive device involve opening windows 73 and 75 in dielectric 71 and blanket deposition and patterning of metal layer 76 (which will form the column line in the about-to-be-discussed array).

Dielectric layer 77 is then deposited over metal line 76.

If desired, a subsequently deposited metal layer may be patterned and contacted through vias to control gates 25 and 27. The metal layer, termed a "strap" may enhance the speed of the device. The essential details of fabrication of the inventive device are now complete.

Figure 12:
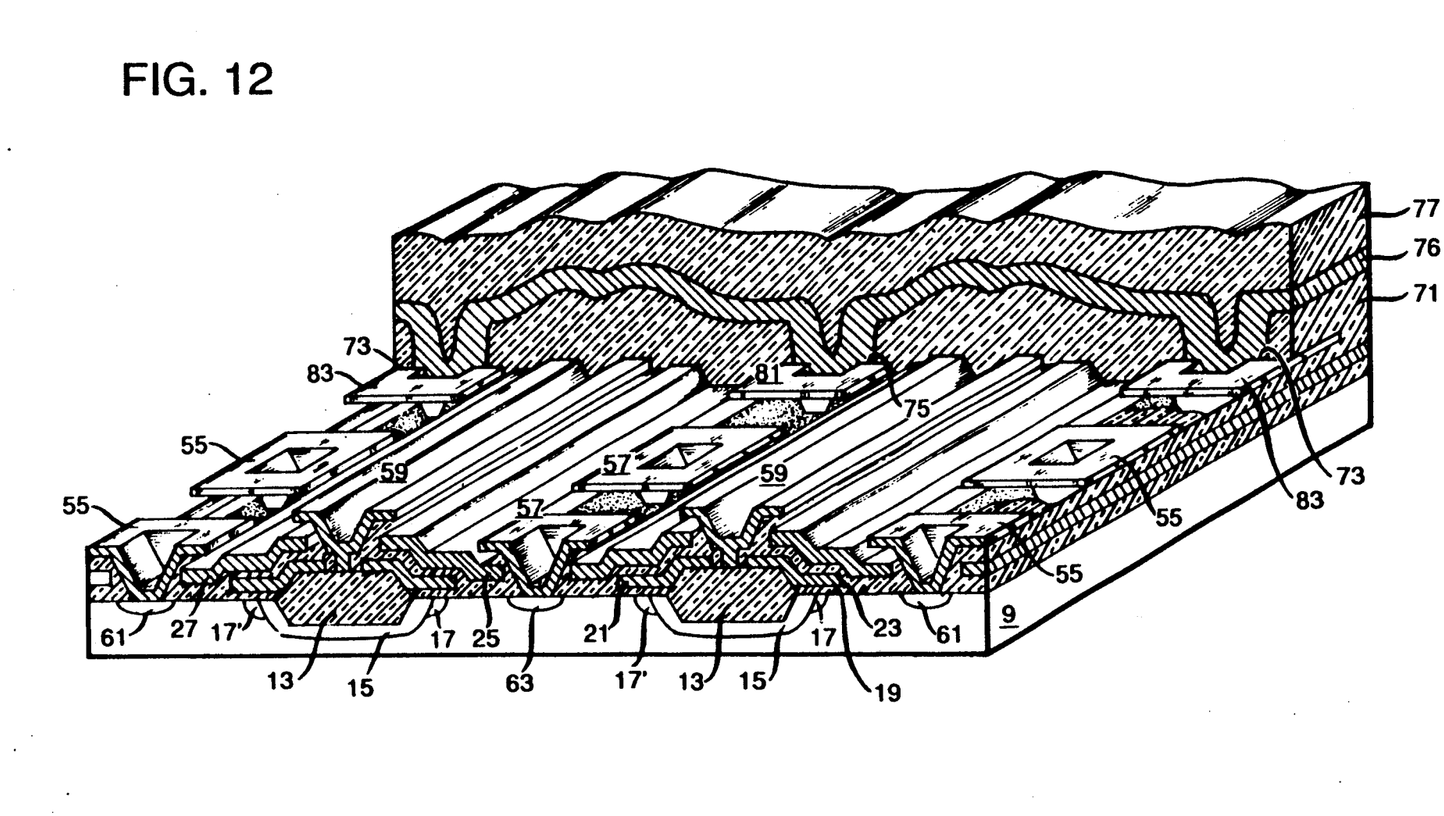
FIG. 12 is a partially perspective partially cross-sectional view of several inventive devices.

Examination of FIGS. 1 and 12 will reveal a few salient features of the inventive device. It will be noted (and made clearer below) that the cross-section of FIG. 1 shows two back-to-back (or mirror image) devices. One device has junctions 15 and 61 with floating gate 23 and control gate 25. The other device has junctions 15 and 63 with floating gate 21 and control gate 27. Thus, junction 15 beneath buried n+ oxide 13 is shared by both devices. Furthermore, erase gate 59 is also shared by both devices.

FIG. 12 illustrates that erase gate 59 extends to cover a multiplicity of pairs of devices (i.e., a pair of rows in the soon-to-be-described array). Similarly, control gates 25 and 27 extend to cover entire rows of devices. However, floating gates 23 and 21 do not extend continuously, as can be seen from the diagram in FIG. 2. There is one discrete floating gate per cell.

Returning to FIG. 12 it will also be noted that each cell pair has one polysilicon landing pad, for example reference numeral 73 or 75. Each landing pad has an upper protrusion 81 or 83 which permits some misalignment of the window through which metal layer 76 is later deposited.

In the next few paragraphs, operation of the inventive device will be described in detail. Turning to FIG. 1, the reading, writing and erasing operations of an individual cell will be described.

Writing (or "programming") is accomplished as follows: FIG. 1 essentially depicts two back-to-back or mirror-image transistors. The present discussion will focus on the right-hand transistor cell for convenience. Operation of the left-hand transistor is similar. It may be convenient to consider buried n+ region 15 and junction 61 as akin to drain/source regions. Approximately 12-15 volts is applied to the word-line of the array in which the inventive device is located (to be described later) which is connected to control gate 25. Buried n+ region 15 is at approximately 8-10 volts, while junction 61 is grounded. Under these conditions, electrons are injected into floating gate 23 by hot carrier injection. Buried p+ region 17 serves to enhance the efficiency of the hot carrier injection mechanism. Buried p+ region 17 essentially decreases the size of the depletion region created in the channel between junction 61 and buried n+ region 15, thus increasing the lateral electric field. The higher lateral electric field enhances hot carrier injection into floating gate 23. Now that floating gate 23 has been "loaded" with electrons, the threshold voltage of the cell transistor between regions 15 and 61 has been increased. This increase in threshold voltage may be subsequently detected and interpreted as a "1" or "0".

Next a means for erasing the cell will be described. Erasing essentially consists of removing the electronic charge from floating gate 23. A high voltage is applied to erase gate 59. Typically, the applied high voltage is between 12 and 24 volts. Control gate 25 is grounded, while regions 15 and 61 are also grounded. Charge tunnels from floating gate 23 through the oxide 50 between floating gate 23 and erase gate 59. Thus, the charge stored on control gate 23 has been removed and the threshold voltage of the transistor between regions 15 and 61 returns to its previous value.

Next, the method by which the cell is read will be described. Reading is the operation by which the presence or absence of charge on the floating gate 23 is detected. Five volts is applied to control gate 25; buried n+ region 15 is grounded. If charge is stored on floating gate 23, the threshold voltage of the transistor device between regions 15 and 61 will be higher than five volts and no current will flow in the cell. If there is no charge stored on floating gate 23, then the cell will turn on and the current can be sensed by a sense amplifier to be described later.

It will be noted from an examination of FIG. 1 that erase gate 59 not only has the ability to erase the right-hand transistor, but also the left hand transistor at the same time.

Figure 3:
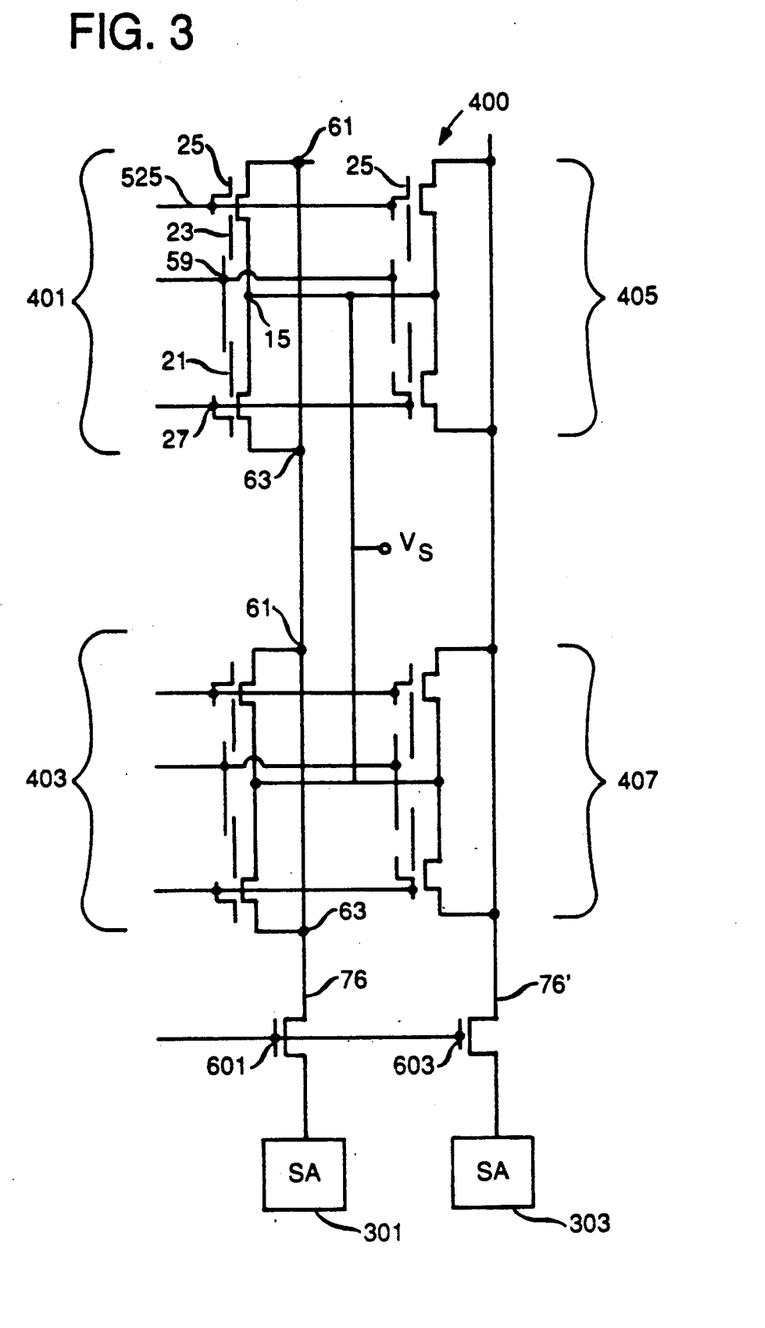
FIG. 3 is a partial array circuit in which the inventive device may be operated.

FIG. 3 illustrates how the pair of mirror-image cells depicted in FIG. 1 may be combined into a memory array 400. Reading, writing, and erasing of an individual cell within array 400 will now be described.

FIG. 3 illustrates transistor cell pairs 401, 403, 405, and 407. Each of the cell pairs has a cross-section similar to that shown in FIG. 1. The reference numerals employed in FIG. 3 suggest correspondence between various circuit schematic elements and the appropriate device physical regions illustrated in FIG. 1. For example, erase gate 59 illustrated in FIG. 1 is shown schematically in FIG. 3; buried n+ region illustrated in FIG. 1 is shown schematically as node 15 in FIG. 3, etc. Suppose, for example, that it is desired to write to the transistor between nodes 15 and 61 of cell pair 401 (i.e., to deposit charge on floating gate 23). Control gate 25 is raised to 12-15 volts via "line" 525 (which is actually the continuous polysilicon sheet control gate 25 shown in cross-section in FIG. 1 and shown in perspective in FIG. 12. However, a separate reference numeral will be used for convenience in the circuit diagram of FIG. 3.) It is desired of course to program only the cell between nodes 15 and 61 of pair 401 and not all of the other cells in the array. Node 15 is set to approximately 10 volts. Node 61 is grounded via metal line 76. Thus, the programming condition for the transistor between nodes 15 and 61 of cell pair 401 (described previously) has been achieved. Consequently, as described before, charge will be injected onto floating gate 23. Of course, it is desirable that other cells in the array not be programmed at the same time. For example, programming of non-selected rows is prevented because the control gates of the transistors in the non-selected rows are grounded. Programming of non-selected columns is prevented because line 76' of the non-selected columns is energized to approximately 10 volts or approximately the same voltage as junction 15. Thus, it can be seen that the programming condition only obtains for the transistor between nodes 51 and 61 of pair 401. Other non-selected transistors cannot be programmed.

Erasing will next be described. Erasing may be accomplished by erasing cell pairs, such as 401, 403, 405, or 407 by simply energizing the erase gate 59 in the manner previously described. Thus, entire row pairs may be erased in a "flash." Of course, if desired, the entire array may be erased simultaneously or pair by pair.

Reading will next be described. Control gate 25 of the selected row for example the row containing the transistor between junctions 15 and 61 is raised to 5 volts, while the control gate of non-selected rows is maintained at ground. Node 15 is grounded. As mentioned before, sense amplifier 301 will sense current flow in the transistor between junctions 15 and 61, if there is no charge stored on floating gate 23 otherwise, no current will be sensed. Select transistors 601 and 603 select the column to be read by sense amplifiers 301 and 303 so that an entire word may be read at once. Or, if desired, separate select transistors may be used to read groups of bit lines at a time.

Thus, what has so far been described is an inventive non-volatile memory structure and the manner in which it may be incorporated into an array to form a memory device. The following paragraphs will enumerate a few advantages of the inventive structure.

Polysilicon landing pads 73 and 75 (which were formed in the same step as erase gate 59) have protrusions 81 and 83. Protrusions 81 and 83 extend outward beyond the extent of junction region 61 and permit some misalignment of the window 51, 53 opening. Thus, if the mask used to create windows 51 and 53 is slightly misaligned with respect to junctions 61 and 63 protrusions 81 and 83 will nevertheless permit effective contact to be made between metal layer 76 and junctions 61 and 63. The use of landing pads such as 55 and 57 is believed heretofore unknown in non-volatile memory cells.

As can be appreciated from the foregoing discussion and FIG. 1, two transistor cells share a common erase gate, for example reference numeral 59 in FIG. 1, thus permitting a higher cell packing density.

The process illustrated by FIGS. 7-10 produces self-aligned floating gate 23 and control gate 25. Consequently, there is no chance of misalignment between the floating gate and control gate. Buried n+ oxide 13 serves to enhance the coupling ratio which is the ratio of the capacitance between floating gate 23 and control gate 25 divided by the total capacitance associated with floating gate 23. An improved coupling ratio increases the programming efficiency of the cell.

Figure 11:
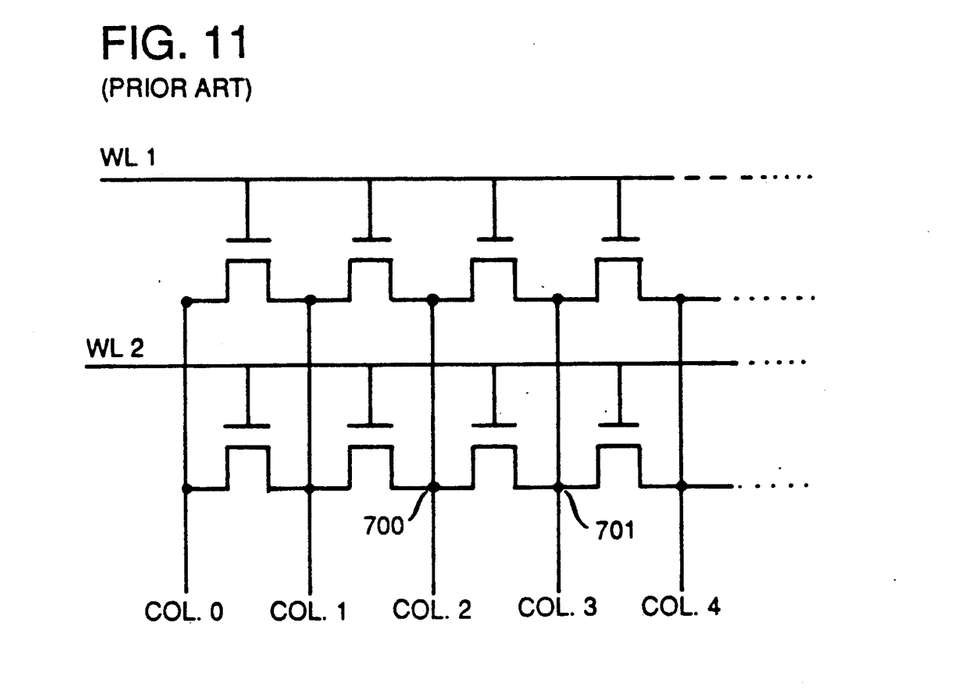
FIG. 11 is a typical prior art circuit.

As designers of memory have sought to reduce cell size, they have tended toward the use of contactless "virtual ground" arrays. The advantage of a virtual ground array is that is does not require a column contact for each cell. The column contacts generally consume space and unduly increase cell size. The polysilicon landing pads 73 and 75 described in connection with FIG. 1, by permitting misalignment of the window opening, allow a column contact for each cell without unreasonably increasing the cell size. More conventional contact structures occupy more space because they must have some tolerance for misalignment. Consequently, certain disadvantages inherent in virtual ground arrays are eliminated. A discussion of virtual ground arrays is contained in "The Design and Analysis of VLSI Circuits" by Glasser et al., Addison Wesley Publishing, 1985, pp. 380-383. Some problems which inhere in the virtual ground array may be illustrated by reference to FIG. 11, which indicates a typical prior art virtual ground array. The figure illustrates five columns and two word lines. One problem exhibited by the virtual ground array is termed "pattern sensitivity." During reading, the loading of a particular column, for example column 2, depends upon the states of the neighboring transistors. For example, the loading at node designated 700 in FIG. 11 depends upon the states of the transistors to the left of node 700, while the loading seen at node 701 depends upon the status of those cells to the right of 701. Consequently, the reading speed of a particular cell varies according to the pattern stored in the entire array. Problems caused by pattern sensitivity cannot always be detected by testing because only certain patterns will cause anomalous results-and these patterns may not occur during test, although they may eventually occur during subsequent use. This disadvantage is not present in applicants' design. Another difficulty with a typical virtual ground array is termed "fault propagation." Should any column, for example, column 2 be shorted to ground, then other columns will "see" the ground if a transistor (or series of transistors) between the two columns is turned on. Consequently, depending upon the pattern stored in the array, if one column line fails (i.e., becomes grounded), a variety of other column lines may also be similarly affected via a network of "turned on" transistors. This difficulty cannot be repaired by redundancy. However, if a column failure occurs in applicants' array, each column is independent as can be seen from FIG. 3, and it may be replaced by a redundant column. The fault propagation problem can, of course, affect the manufacturing yield of wafers with virtual ground devices since a device with a defective column cannot be repaired and must be discarded. The array depicted in FIG. 3 is a NOR-type array which has fallen somewhat out of favor with non-volatile designers since it requires windowed contacts to individual cells although it does not exhibit the aforementioned problems of pattern sensitivity and fault propagation.

Figure 2:
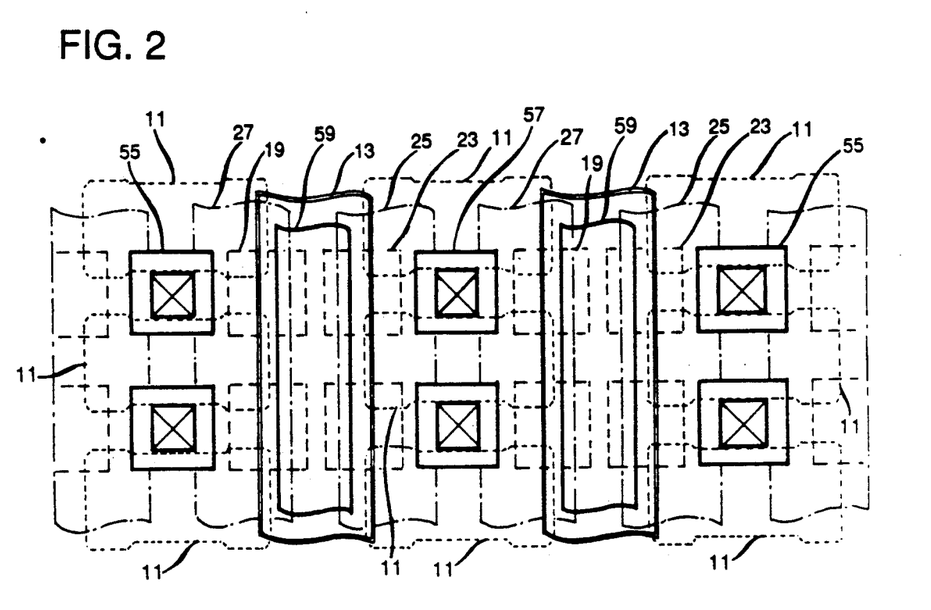
FIG. 2 is a schematic top view of the structure shown in FIG. 1.

Another advantage of the inventive design which can be appreciated from FIG. 2 is that field oxide 11 extends lengthwise between two cells. Consequently, if the cell size is shrunk lengthwise, the field oxide's critical dimension (i.e., width) is not affected. Designs with comparatively smaller field oxides (relative to total cell size) do not scale downward as easily because the field oxide structure, when shrunk tends to exhibit rounded corners and, because of the formation of long birds' beaks, the field oxide maximum thickness is suppressed.

Thus, the unique inventive cell design depicted in FIG. 1 permits incorporation into an array which avoids the disadvantages of the commonly used virtual ground array, thus permitting small cell size together with the attendant advantages of high yield, high speed, and high reliability.

We claim:

1. A semiconductor device comprising a pair of EEPROM cells comprising
   a substrate of first conductivity type and having a surface:
   a thermal oxide region overlying said substrate and penetrating into said substrate and having an oxide surface extending beyond the said surface of said substrate;
   a first junction region of second conductivity type underlying said oxide region;
   second and third junction regions, on opposite sides of said first junction region, both said second and third junction regions contacting said substrate surface, said first junction region and said second junction region defining a first channel and said first junction region and said third junction region defining a second channel;
   fourth and fifth junction regions, both of first conductivity type, said fourth junction region being between said first junction region and said second junction region and said fifth junction region being between said first junction region and said third junction region;
   first and second floating gates, each at least partially overlying said respective first and second channels and each at least partially overlying said oxide region;
   first and second control gates each at least partially overlying said respective first and second channels, and each at least partially overlying said respective first and second floating gates;
   an erase gate overlying said oxide region and overlying at least portions of said first and second floating gates;
   first and second landing pads, said first landing pad contacting said second junction region and said second landing pad contacting said third junction, each of said landing pads having a protusion extending from said contacted junction region and overlying one of said channels;
   a patterned conductive runner contacting at lease one of said landing pads.

2. The pair of cells in claim 1 further including a patterned conductive runner contacting at least one of said control gates.

3. A semiconductor memory device comprising:

a plurality of pairs of first and second devices, each of said pairs having a substrate with a surface;

an oxide region overlying said substrate and penetrating into said substrate and having an oxide surface extending beyond the said surface of said substrate;

a first junction region underlying said oxide region and second and third junctions on opposite sides of said first junction, both said second and third junctions contacting said substrate surface;

said first junction region and said second junction region defining a first channel in said first device and said first junction and said third junction defining a second channel in said second device;

each of said pairs further having:

first and second floating gates each at least partially overlying said respective first and second channels;

first and second control gates each at least partially overlying said respective first and second channels, and being electrically isolated from first and second channels and said first and second floating gates by dielectric regions;

an erase gate overlying said oxide region and overlying at least portions of said first and second floating gates, and being electrically isolated from first and second floating gates and said first and second control gates by dielectric regions;

and further in which a plurality of said first devices share a common erase gate and a first common control gate and a plurality of said second devices share the same said common erase gate and share a second common control gate and further in which a plurality of said second and third junctions are connected together to form a bit line, a plurality of said first junctions are connected together so that they may be either simultaneously energized or grounded;

whereby selective energization of one of said common control gates, together with selective energization of one of said bit lines, together with selective energization of said plurality of first junctions enables either charge detection or storage upon a single said floating gate and energization of one of said erase gates enables charge removal from a plurality of said pairs of devices.

* * * * *